United States Patent
Kobayashi et al.

(10) Patent No.: US 6,713,437 B2
(45) Date of Patent: Mar. 30, 2004

(54) PRESSURE HEAT TREATMENT APPARATUS EMPLOYED FOR PREPARING OXIDE SUPERCONDUCTING WIRE

(75) Inventors: Shinichi Kobayashi, Osaka (JP); Tetsuyuki Kaneko, Osaka (JP); Ryosuke Hata, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 10/279,833

(22) Filed: Oct. 25, 2002

(65) Prior Publication Data
US 2003/0059734 A1 Mar. 27, 2003

Related U.S. Application Data

(62) Division of application No. 09/903,622, filed on Jul. 13, 2001.

(30) Foreign Application Priority Data

Jul. 14, 2000 (JP) ........................................ 2000-213583
Feb. 15, 2001 (JP) ........................................ 2001-038367

(51) Int. Cl.[7] .............................. F27D 19/00; F27B 5/04; H01L 39/24
(52) U.S. Cl. ........................ 505/500; 505/450; 432/37; 432/42; 432/48; 432/205; 110/185
(58) Field of Search ........................... 432/36, 37, 38, 432/39, 40, 41, 42, 43, 44, 45, 46, 47, 48, 49, 51, 52, 53, 200, 201, 202, 203, 204, 205; 110/185; 505/500, 511, 450

(56) References Cited

U.S. PATENT DOCUMENTS

| | | | | |
|---|---|---|---|---|
| 4,036,753 A | * | 7/1977 | Majima et al. | 110/346 |
| 4,596,198 A | * | 6/1986 | Greskovich et al. | 110/347 |
| 5,155,092 A | * | 10/1992 | Mizuno et al. | 505/126 |
| RE34,298 E | * | 6/1993 | Gitman et al. | 431/5 |
| 5,324,415 A | * | 6/1994 | Blumenthal et al. | 204/427 |
| 5,498,487 A | * | 3/1996 | Ruka et al. | 429/20 |
| 5,556,556 A | * | 9/1996 | Blumenthal et al. | 205/784.5 |
| 5,750,188 A | * | 5/1998 | Menu | 427/126.3 |
| 5,974,077 A | * | 10/1999 | Abiko et al. | 373/140 |
| 6,051,078 A | * | 4/2000 | Naito et al. | 148/215 |
| 6,106,636 A | * | 8/2000 | Naito et al. | 148/215 |
| 6,106,963 A | * | 8/2000 | Nitta et al. | 429/19 |
| 6,207,619 B1 | * | 3/2001 | Fischer et al. | 505/501 |
| 6,555,503 B1 | | 4/2003 | Li et al. | |

FOREIGN PATENT DOCUMENTS

JP  5-101723  4/1993

OTHER PUBLICATIONS

PCT Publication No. WO 01/22436, Published with Search Report, Publication Date Mar. 29, 2001, (PCT US 00/25749).

* cited by examiner

*Primary Examiner*—M. Alexandra Elve
*Assistant Examiner*—Colleen P. Cooke
(74) *Attorney, Agent, or Firm*—Foley & Lardner

(57) ABSTRACT

The method of preparing an oxide superconducting wire comprises steps of preparing a wire by coating raw material powder for a Bi—Pb—Sr—Ca—Cu—O based oxide superconductor including a 2223 phase with a metal and heat treating the wire in a pressurized atmosphere containing oxygen in a prescribed partial pressure, and the total pressure of the pressurized atmosphere is at least 0.5 MPa. The pressure heat treatment apparatus comprises a pressure furnace storing and heat treating a target in a pressurized atmosphere, a pressure regulator for measuring the total pressure in the pressure furnace, an oxygen concentration meter for measuring the oxygen concentration in the pressure furnace and a controller for controlling the oxygen partial pressure in the pressure furnace in response to the total pressure measured by the pressure regulator and the oxygen concentration measured by the oxygen concentration meter.

5 Claims, 1 Drawing Sheet

PRESSURE HEAT TREATMENT APPARATUS EMPLOYED FOR PREPARING OXIDE SUPERCONDUCTING WIRE

CROSS-REFERENCE TO RELATED PATENT APPLICATIONS

This application is a division of application Ser. No. 09/903,622, filed Jul. 13, 2001, now pending, and based on Japanese Patent Applications No. 2000-213583, filed Jul. 14, 2000 and, No. 2001-038367, filed Feb. 15, 2001 by Shinichi Kobayashi, Tetsuyuki Kaneko and Ryosuke Hata. This application claims only subject matter disclosed in the parent application and therefore presents no new matter.

BACKGROUND OF THE INVENTION

1. Field of the Invention

The present invention relates to a method of preparing an oxide superconducting wire and a pressure heat treatment apparatus employed for the method, and more particularly, it relates to a method of preparing an oxide superconducting wire capable of preventing the wire from expansion in sintering and a pressure heat treatment apparatus employed for the method.

2. Description of the Prior Art

Generally known is a method of preparing an oxide superconducting wire by heat treating a wire obtained by charging a metal tube with raw material powder for an oxide superconductor and thereafter drawing or rolling the metal tube for sintering the raw material powder for the oxide superconductor. In the aforementioned heat treatment step for sintering, however, the wire is disadvantageously expanded to reduce superconductivity of the obtained oxide superconducting wire.

Japanese Patent Laying-Open No. 5-101723 (1993) proposes a method of preparing an oxide superconducting wire by heat treating a metal tube charged with powder of an oxide superconductor or a flat body thereof under a pressurized atmosphere for sintering the powder of the oxide superconductor. This gazette describes that a wire having excellent superconductivity is obtained by pressure heat treatment.

More specifically, the metal tube charged with the powder of the oxide superconductor is stored in a heat-resistant and pressure-resistant closed vessel to be prevented from expansion in sintering due to the internal pressure increased following temperature increase in the closed vessel. The internal pressure can be obtained from a state equation of gas or the like, and the aforementioned gazette describes that an internal pressure of about 4 atm. can be obtained with a heating temperature of about 900° C., for example.

However, the internal pressure obtained following temperature increase in the closed vessel is only about 4 atm. (0.4 MPa), and it is difficult to sufficiently suppress expansion of the metal tube in sintering.

Further, the internal pressure varies with the temperature in the closed vessel, leading to pressure reduction in the process of temperature increase up to the sintering temperature and in the process of temperature reduction to the room temperature after sintering. Therefore, expansion caused by gas generated at a temperature below the sintering temperature cannot be effectively prevented.

SUMMARY OF THE INVENTION

An object of the present invention is to provide a method of preparing an oxide superconducting wire capable of effectively preventing expansion in a heat treatment step for sintering raw material powder for an oxide superconductor coated with a metal and obtaining an oxide superconducting wire having desired superconductivity and a pressure heat treatment apparatus employed for this method.

The method of preparing an oxide superconducting wire according to the present invention comprises steps of preparing a wire by coating with a metal raw material powder for a Bi—Pb—Sr—Ca—Cu—O based oxide superconductor containing bismuth, lead, strontium, calcium and copper and including a 2223 phase having composition ratios of (bismuth and lead), strontium, calcium and copper approximately expressed as 2:2:2:3 and heat treating the wire in a pressurized atmosphere containing oxygen in a prescribed partial pressure, and the total pressure of the pressurized atmosphere is at least 0.5 MPa.

When the total pressure of the pressurized atmosphere is set to at least 0.5 MPa as described above, the wire can be inhibited from expansion caused by gas generated in the raw material powder for the oxide superconductor present in the wire.

In the aforementioned method of preparing an oxide superconducting wire, the total pressure of the pressurized atmosphere is preferably kept at least 0.5 MPa from beginning to end of the heat treatment in the step of heat treating the wire.

The wire can be inhibited also from expansion caused by gas generated in the process of temperature increase and in the process of temperature reduction by keeping the total pressure of the pressurized atmosphere at least 0.5 MPa from the beginning of the process of temperature increase to the end of the process of temperature reduction.

In the aforementioned method of preparing an oxide superconducting wire, the oxygen partial pressure in the pressurized atmosphere is preferably at least 0.003 MPa and not more than 0.02 MPa. Further, the heat treatment temperature is preferably at least 800° C. and not more than 840° C., and more preferably at least 810° C., and not more than 830° C. in the step of heat treating the wire.

Superconductivity of the oxide superconducting wire such as the critical current can be improved by defining the oxygen partial pressure and/or the heat treatment temperature as described above.

The method of preparing an oxide superconducting wire according to the present invention preferably further comprises a step of preparing the raw material powder for the oxide superconductor by repeating pulverization and heat treatment.

Further, the method of preparing an oxide superconducting wire according to the present invention preferably further comprises a step of heat treating the raw material powder for the oxide superconductor under decompression and thereafter charging the raw material powder into a metal tube.

In the method of preparing an oxide superconducting wire according to the present invention, the step of preparing the wire preferably includes an operation of drawing the metal tube thereby preparing a wire coated with a metal. The step of preparing the wire preferably includes an operation of charging into another metal tube a plurality of wires obtained by drawing the metal tube and thereafter performing drawing and rolling on this metal tube thereby preparing a tape-like wire.

The method of preparing an oxide superconducting wire according to the present invention is preferably applied to preparation of a wire consisting of a Bi—Pb—Sr—Ca—Cu—O based oxide superconductor, particularly optimum when employing raw material powder for an oxide superconductor having composition ratios of (Bi+Pb), Sr, Ca and Cu approximately expressed as 2:2:2:3, and suitable for preparing a wire of a Bi-based oxide superconductor including a 2223 phase having the aforementioned composition ratios, for example.

The pressure heat treatment apparatus employed for the method of preparing an oxide superconducting wire according to the present invention comprises a pressure heat treatment furnace storing a target for heat treating the target in a pressurized atmosphere, a pressure measuring device for measuring the total pressure in the pressure heat treatment furnace, an oxygen concentration measuring device for measuring the oxygen concentration in the pressure heat treatment furnace and an oxygen partial pressure control part for controlling the oxygen partial pressure in the pressure heat treatment furnace in response to the total pressure measured by the pressure measuring device and the oxygen concentration measured by the oxygen concentration measuring device.

In the pressure heat treatment apparatus having the aforementioned structure, the oxygen partial pressure in the pressure heat treatment furnace can be precisely controlled. When this pressure heat treatment apparatus is employed for the method of preparing an oxide superconducting wire according to the present invention, the oxygen partial pressure in the pressurized atmosphere can be precisely controlled in the step of heat treating the wire, thereby readily obtaining an oxide superconducting wire having superconductivity such as a desired critical current.

The pressure heat treatment apparatus according to the present invention preferably further comprises a gas introduction device for introducing oxygen gas or non-oxygen gas into the pressure heat treatment furnace in response to a control signal output from the oxygen partial pressure control part.

In this case, the oxygen partial pressure in the pressure heat treatment furnace can be readily controlled by simply introducing oxygen gas or non-oxygen gas into the pressure heat treatment furnace.

According to the inventive method of preparing an oxide superconducting wire, as hereinabove described, the wire can be effectively inhibited from expansion in the heat treatment step, while superconductivity such as the critical current can be improved by controlling the oxygen partial pressure in the pressurized atmosphere within a prescribed range. In the pressure heat treatment apparatus according to the present invention, further, the oxygen partial pressure in the pressure heat treatment furnace can be precisely controlled. When this pressure heat treatment apparatus is employed for the method of preparing an oxide superconducting wire according to the present invention, the oxygen partial pressure in the pressurized atmosphere can be precisely controlled in the step of heat treating the wire, thereby readily obtaining an oxide superconducting wire having superconductivity such as a desired critical current as a result.

The foregoing and other objects, features, aspects and advantages of the present invention will become more apparent from the following detailed description of the present invention when taken in conjunction with the accompanying drawing.

DETAILED DESCRIPTION OF THE PREFERRED EMBODIMENTS

Figure 1:
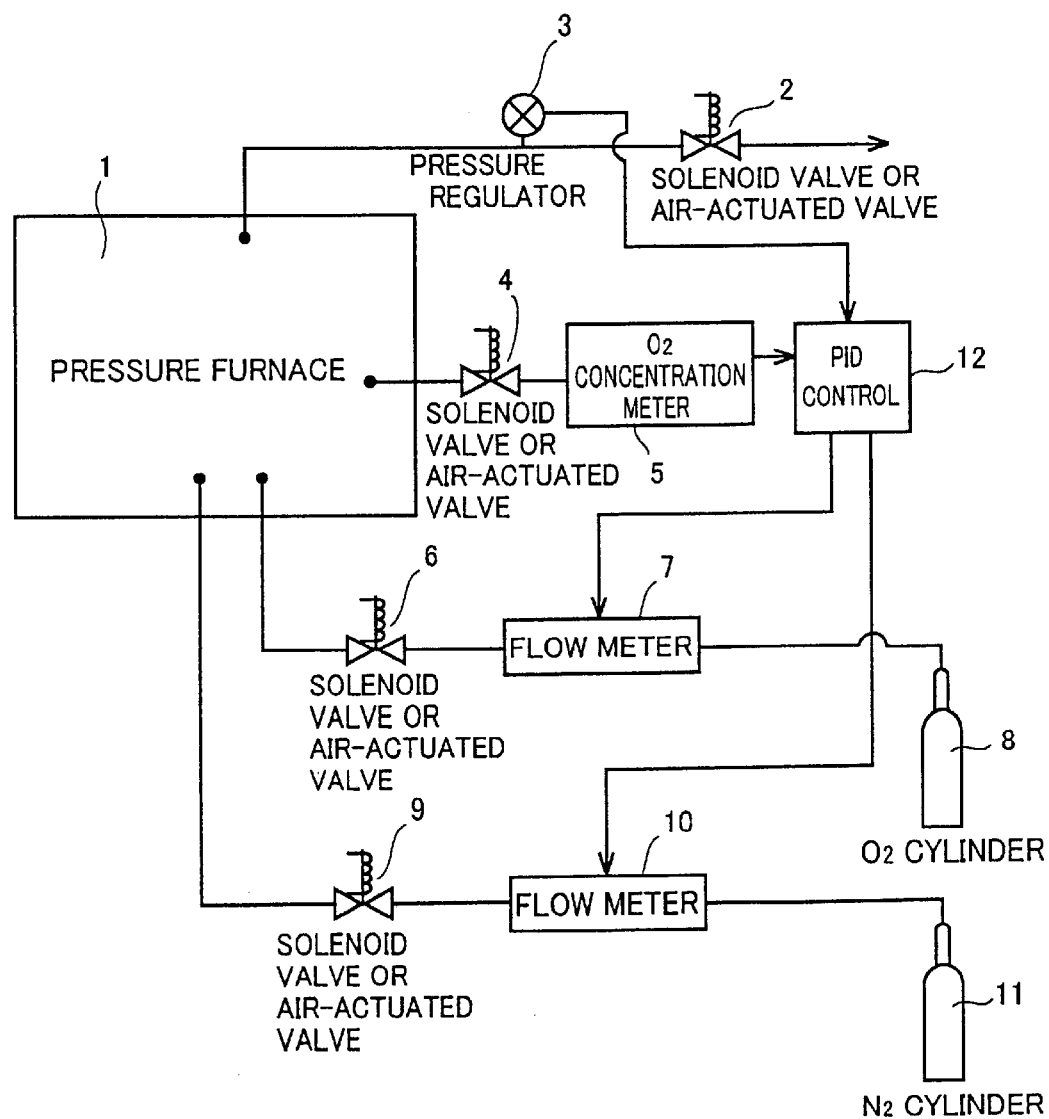
FIG. 1 schematically illustrates the structure of a pressure heat treatment apparatus employed for a method of preparing an oxide superconducting wire according to the present invention.

In the method disclosed in Japanese Patent Laying-Open No. 5-101723, the metal tube is conceivably prevented from expansion since the metal tube is pressed from outside with the same pressure as that expanded in the metal tube when gas present in clearances (the filling factor is generally about 80% of the theoretical density before sintering) in the powder of the oxide superconductor stored in the metal tube is volume-expanded at a high temperature. If the metal tube is not expanded in this case, the volumes in the metal tube and the pressure vessel remain constant and hence the pressures in the metal tube and the pressure vessel storing the metal tube are changed when the sintering temperature is increased.

When the inventor studied the cause of expansion of such a wire, however, it was recognized that adsorbates such as carbon (C), water ($H_2O$) and oxygen ($O_2$) adhering to raw material powder for an oxide superconductor are vaporized during sintering to exert remarkable influence on volume expansion in a metal tube, leading to expansion of the wire. The inventor has discovered that the total pressure in a pressurized atmosphere for heat treating the wire must be at least 5 atm. (0.5 MPa) in order to suppress expansion caused not only by gas present in the clearances between grains forming the raw material powder for the oxide superconductor but also by vaporization of adsorbates adhering to the surfaces of the grains.

In a method of charging raw material powder for an oxide superconductor into a metal tube and thereafter heat treating the obtained wire, the powder adsorbs or contains various types of gas, and hence the gas present in the clearances between the grains forming the raw material powder is liberated during the heat treatment to expand the wire. This liberation of the gas and the expansion caused by the gas exert bad influence on the oxide superconducting wire.

Also when the gas is homogeneously liberated as a whole in a small quantity, the liberated gas penetrates into the clearances between the oxide superconducting crystal grains to hinder connection between the crystal grains, i.e. electrical connection. Thus, the characteristic of the obtained oxide superconducting wire, particularly the critical current, is reduced.

In a tape-like oxide superconducting wire of 0.24 mm in thickness and 3.2 to 3.6 mm in width having a number of oxide superconductor filaments of 10 $\mu$m in thickness and 100 $\mu$m in width, for example, each oxide superconductor filament is formed by an aggregate of oxide superconductor crystal gains of 2 $\mu$m in thickness and 10 $\mu$m in width. While a current flows between the crystal grains of the oxide superconductor in this case, the path of the current is hindered when gas is present between the crystal grains.

When the gas is locally largely liberated, large expansion is caused to deform the shape of the wire itself on the part exposed to this gas liberation and locally reduce the critical current.

As means of suppressing the aforementioned liberation of gas, a method of heat treating the wire with pressurization is proposed in Japanese Patent Laying-Open No. 5-101723, for example, as described above. However, this method, capable of suppressing expansion caused by gas liberation only when the gas is homogeneously liberated as a whole in a small quantity, is insufficient for suppressing expansion caused by gas liberation when the gas is locally largely liberated.

In the method of preparing an oxide superconducting wire according to the present invention, the wire can be effectively prevented from expansion caused by gas liberation whether the gas is homogeneously liberated as a whole in a small quantity or locally largely liberated by setting the total pressure of the pressurized atmosphere to at least 0.5 MPa.

In the method disclosed in Japanese Patent Laying-Open No. 5-101723, the pressure applied to the wire through the closed vessel varies with the temperature in the closed vessel. When the wire is heat treated, gas components such as $H_2O$, $CO_2$ and $O_2$ are generated in the wire, i.e., in the metal tube. $H_2O$, $CO_2$ and $O_2$ are generated in temperature regions of 100 to 300° C., 700 to 800° C. and 800 to 900° C. respectively. In order to suppress such gas components generated from the inner part of the wire by applying a pressure to the outer side of the wire, an external pressure must be applied at a temperature of at least 100° C. In the method disclosed in the aforementioned gazette, however, the pressure is reduced in response to the temperature in the closed vessel in the process of temperature increase up to the heat treatment temperature and in the process of temperature reduction after the heat treatment, and hence the wire cannot be prevented from expansion caused by generation of the aforementioned gas components in the temperature region below the heat treatment temperature.

In the method of preparing an oxide superconducting wire according to the present invention, the total pressure of the pressurized atmosphere is preferably kept at least 0.5 MPa in the overall step of heat treating the wire, i.e., from the starting point of the heat treatment in the process of temperature increase to the end point of the heat treatment in the process of temperature reduction. Thus, the total pressure of the pressurized atmosphere is kept at least 0.5 MPa in the starting point of the heat treatment within the temperature region of less than 100° C. as well as in the end point of the heat treatment reaching the temperature region of less than 100° C., whereby the wire can be inhibited also from expansion caused by gas generated in a temperature region below the heat treatment temperature.

In the method of preparing an oxide superconducting wire according to the present invention, the wire, heat treated in the pressurized atmosphere of at least 5 atm. (0.5 MPa), can be inhibited from expansion caused by gas generation in the wire. Particularly when the length of the wire exceeds 10 m, it is unconceivable that the gas is naturally and entirely liberated from end portions of the wire, and hence the effect according to the inventive method is further increased. Thus, superconductivity of the obtained oxide superconducting wire can also be improved by suppressing expansion of the wire.

In relation to preparation of a bismuth-based oxide superconductor having a 2223 phase, it is known that the 2223 phase is stably generated when the wire is heat treated under such a condition that the heat treatment atmosphere for sintering contains oxygen in the ratio of 20 to 3% with respect to a total pressure of 1 atm. When pressure heat treatment is performed on the wire as disclosed in Japanese Patent Laying-Open No. 5-101723, however, the 2223 phase may not be stably generated even if the wire is heat treated in a pressurized atmosphere with a gas mixture containing oxygen in the aforementioned ratio. When the powder of the oxide superconductor is sintered in a closed vessel having an internal pressure of about 4 atm. in a gas mixture containing about 80% of nitrogen and about 20% of oxygen, i.e., in the air, the oxygen partial pressure reaches 0.8 atm. in response to the oxygen content. The inventor has found that this oxygen pressure is out of a condition for stably generating the 2223 phase of the bismuth-based oxide superconductor. The inventor has also found that the 2223 phase of the bismuth-based oxide superconductor can be stably generated when the oxygen partial pressure in the pressurized atmosphere is kept at 0.03 to 0.2 atm. (0.003 to 0.02 MPa), even if the total pressure of the pressurized atmosphere is changed. In order to heat treat the wire in a pressurized atmosphere of 10 atm., for example, a gas mixture containing 0.3 to 2% of oxygen must be employed for performing heat treatment so that the oxygen partial pressure is 0.03 to 0.2 atm. In order to stably generate the phase of the oxide superconductor, it is extremely important to properly control the oxygen partial pressure condition also when expansion can be suppressed by performing heat treatment in the pressurized atmosphere.

In the method of preparing an oxide superconducting wire according to the present invention, therefore, the oxygen partial pressure in the pressurized atmosphere is preferably controlled to at least 0.003 MPa and not more than 0.02 MPa also when changing the total pressure of the pressurized atmosphere. In other words, the oxygen content in the pressurized atmosphere is preferably varied with the total pressure of the pressurized atmosphere, in order to control the oxygen partial pressure in the pressurized atmosphere within the aforementioned range. Thus, the 2223 phase of the oxide superconductor contained in the oxide superconducting wire can be stably generated.

As to the structure of the oxide superconducting wire, the periphery of oxide superconductor filaments is coated with a metal such as silver or a silver alloy. Therefore, the oxygen partial pressure on the outer side of the wire is hardly equivalent to the oxygen partial pressure around the oxide superconductor filaments generated in the wire even if controlled in the steps of preparing the oxide superconducting wire. However, the oxygen partial pressure in the wire can be forcibly controlled to a desired value by maintaining the pressurized atmosphere under conditions of an oxygen partial pressure desirable for generating the phase of the oxide superconductor and increasing the total pressure of the pressurized atmosphere. Therefore, the raw material powder for the oxide superconductor is more densely sintered and the critical current of the oxide superconducting wire can be increased by increasing the pressure of the atmosphere when heat treating the wire.

As hereinabove described, the oxygen partial pressure in the pressurized atmosphere is more preferably controlled in the method of preparing an oxide superconducting wire according to the present invention. The reaction for generating the target phase of the oxide superconductor can be improved, the wire can be prevented from expansion in the pressure heat treatment, and superconductivity can be improved by adjusting the oxygen content in the pressurized atmosphere in response to the total pressure in the pressurized atmosphere and controlling the oxygen partial pressure to a desired level, i.e., at least 0.003 MPa and not more than 0.02 MPa. Thus, the wire can be inhibited from local deterioration caused by expansion and an oxide superconducting wire excellent in superconductivity can be provided by employing the inventive method.

In the method of preparing an oxide superconducting wire according to the present invention, the heat treatment temperature is more preferably controlled in response to the oxygen partial pressure in the pressurized atmosphere. The heat treatment temperature is preferably controlled within the range of at least 780° C. and not more than 850° C. with respect to the oxygen partial pressure of at least 0.003 MPa and not more than 0.02 MPa, while the heat treatment temperature is more preferably controlled within the range of at least 800° C. and not more than 840° C. and further preferably controlled within the range of at least 810° C. and not more than 830° C. in order to improve superconductivity such as the critical current.

FIG. 1 schematically shows the structure of a pressure heat treatment apparatus employed for the method of preparing an oxide superconducting wire according to the present invention. As shown in FIG. 1, a pressure furnace 1 serving as a pressure heat treatment furnace stores a target such as a wire for pressurizing/heat treating the target. A closed vessel such as a high-temperature isostatic pressing (HIP) vessel or the like may be employed as the pressure furnace 1. An exhaust valve 2 discharges gas from the pressure furnace 1. A pressure regulator 3 regulates and measures the total pressure in the pressure furnace 1. A gas delivery valve 4 delivers the gas from the pressure furnace 1, so that an oxygen concentration meter 5 measures the oxygen concentration thereof. An electric signal corresponding to the value of the total pressure in the pressure furnace 1 regulated and measured by the pressure regulator 3 and an electric signal corresponding to the oxygen concentration in the gas stored in the pressure furnace 1 measured by the oxygen concentration meter 5 are transmitted to a controller 12. The controller 12 outputs a control signal for controlling the oxygen partial pressure in the pressure furnace by PID (proportional integral and differential) control in response to the aforementioned two electric signals, and supplies the control signal to an oxygen flow meter 7 and a nitrogen flow meter 10. If the oxygen partial pressure calculated from the measured total pressure and oxygen concentration is less than a prescribed set value, a necessary amount of oxygen gas regulated by the oxygen flow meter 7 is fed into the pressure furnace 1 from an oxygen cylinder 8 through an oxygen introduction valve 7 until the oxygen partial pressure reaches the prescribed set value. If the aforementioned calculated oxygen partial pressure is in excess of the prescribed set value to the contrary, a necessary amount of nitrogen gas regulated by the nitrogen flow meter 10 in response to the control signal is fed into the pressure furnace 1 from a nitrogen cylinder 11 through a nitrogen introduction valve 9. The oxygen gas or nitrogen gas must be fed while controlling the total pressure in the pressure furnace 1 and maintaining the same at a constant value by the pressure regulator 3.

The pressure heat treatment apparatus having the aforementioned structure is employed for pressurizing/heat treating a wire prepared by coating raw material powder for a Bi—Pb—Sr—Ca—Cu—O based oxide superconductor including a 2223 phase with a metal. This wire is stored in the pressure furnace 1. The pressure regulator 3 keeps the total pressure in the pressure furnace 1 at least 0.5 MPa from a starting point of heat treatment in the process of temperature increase in the pressure furnace 1 to an end point of heat treatment in the process of temperature reduction in the pressure furnace 1. A necessary amount of oxygen gas regulated by the oxygen flow meter 7 is fed from the oxygen cylinder 8 into the pressure furnace 1 through the oxygen introduction valve 6 or a necessary amount of nitrogen gas regulated by the nitrogen flow meter 10 is fed into the pressure furnace 1 from the nitrogen cylinder 11 through the nitrogen introduction valve 9 until the oxygen partial pressure calculated from the total pressure regulated by the pressure regulator 3 and the oxygen concentration measured by the oxygen concentration meter 5 reaches a prescribed value within the range of at least 0.003 MPa and not more than 0.02 MPa. When the oxygen partial pressure reaches the prescribed value, the oxygen introduction valve 6 and the nitrogen introduction valve 9 are closed. Thereafter the wire is heat treated.

EXAMPLE 1

Powder materials of compounds $Bi_2O_3$, $PbO$, $SrCO_3$, $CaCO_3$ and $CuO$ were mixed with each other to prepare a powder mixture containing Bi, Pb, Sr, Ca and Cu in the ratios 1.82:0.33:1.92:2.01:3.02 as raw material powder for a bismuth-based oxide superconductor. This powder mixture was heat treated at a temperature of 750° C. for 10 hours, and thereafter further heat treated at a temperature of 800° C. for 8 hours. The heat treated powder mixture was pulverized in an automatic mortar. The powder obtained by this pulverization was heat treated at a temperature of 850° C. for 4 hours, and thereafter pulverized in the automatic mortar again.

The powder obtained in the aforementioned manner was heat treated under decompression, and thereafter charged into a silver pipe of 36 mm in outer diameter and 30 mm in inner diameter. Then, the silver pipe charged with the powder was drawn. 61 wires obtained in this manner were bundled and engaged in a silver pipe of 36 mm in outer diameter and 31 mm in inner diameter, which in turn was subjected to drawing and rolling. The rolling was performed with a draft of about 80%. Thus, tape-like wires of 0.25 mm in thickness and 3.6 mm in width were obtained.

The wires of the bismuth-based oxide superconductor having a 2223 phase prepared in the aforementioned manner were superposed with each other through a clearance member of ceramic paper consisting of a mixture of alumina fiber and zirconia powder, and wound on a spool of a stainless alloy having a diameter of 50 cm. A prescribed pressure was applied to the superposed wires and thereafter heating was started to heat treat the superposed wires under prescribed conditions. After the heat treatment, the wires were cooled to the room temperature, and thereafter the pressure was removed.

As shown in Table 1, the total pressure of the pressurized atmosphere was varied in the range of 0.1 to 20.0 MPa, for performing first heat treatment on the wires of respective samples. In each sample, the oxygen partial pressure, the heat treatment temperature and the heat treatment time were set to 0.02 MPa, 840° C. and 50 hours respectively. Thereafter the wire of each sample was rolled with a rolling reduction of about 15%, and thereafter the total pressure of the pressurized atmosphere was varied in the range of 0.1 to 20.0 MPa as shown in Table 1 for performing second heat treatment. In each sample, the oxygen partial pressure, the heat treatment temperature and the heat treatment time were set to 0.02 MPa, 835° C. and 50 hours respectively. After the heat treatment, the degree of expansion of the wires was evaluated and the critical current was measured at a temperature of 77 K. Table 1 also shows the results.

TABLE 1

| Sample | Total Pressure (MPa) | Oxygen Partial Pressure (MPa) | Heat Treatment Temperature (°C) first | Heat Treatment Temperature (°C) second | Heat Treatment Time (Hr) | Critical Current (A) | Expansion of Wire |
|---|---|---|---|---|---|---|---|
| 1 | 0.1 | 0.02 | 840 | 835 | 50 | 45 | yes |
| 2 | 0.2 | 0.02 | 840 | 835 | 50 | 45 | yes |
| 3 | 0.3 | 0.02 | 840 | 835 | 50 | 46 | yes |
| 4 | 0.4 | 0.02 | 840 | 835 | 50 | 47 | yes |

TABLE 1-continued

| Sample | Total Pressure (MPa) | Oxygen Partial Pressure (MPa) | Heat Treatment Temperature ( ) first | Heat Treatment Temperature ( ) second | Heat Treatment Time (Hr) | Critical Current (A) | Expansion of Wire |
|---|---|---|---|---|---|---|---|
| 5 | 0.5 | 0.02 | 840 | 835 | 50 | 47 | no |
| 6 | 0.8 | 0.02 | 840 | 835 | 50 | 49 | no |
| 7 | 1.0 | 0.02 | 840 | 835 | 50 | 55 | no |
| 8 | 1.5 | 0.02 | 840 | 835 | 50 | 56 | no |
| 9 | 2.0 | 0.02 | 840 | 835 | 50 | 65 | no |
| 10 | 3.0 | 0.02 | 840 | 835 | 50 | 68 | no |
| 11 | 5.0 | 0.02 | 840 | 835 | 50 | 70 | no |
| 12 | 10.0 | 0.02 | 840 | 835 | 50 | 82 | no |
| 13 | 20.0 | 0.02 | 840 | 835 | 50 | 98 | no |

It is clearly understood from Table 1 that the degree of expansion of the wire depends on the total pressure of the pressurized atmosphere such that no effect of suppressing expansion of the wire is attained if the total pressure of the pressurized atmosphere is not more than 0.4 MPa while an effect of suppressing expansion of the wire is attained if the total pressure exceeds 0.5 MPa. It is also understood that the critical current of the wire is also improved as the total pressure of the pressurized atmosphere is increased.

In the aforementioned Example 1, the heat treatment is performed twice in order to attain desired superconductivity, i.e., a desired critical current. In relation to confirmation of the effect of suppressing expansion of the wire, it has been confirmed that no effect of suppressing expansion of the wire is attained if the total pressure of the pressurized atmosphere is not more than 0.4 MPa while the effect of suppressing expansion of the wire is attained if the total pressure exceeds 0.5 MPa also when the heat treatment is performed once.

EXAMPLE 2

Tape-like wires of a bismuth-based oxide superconductor were prepared similarly to Example 1. The wires were superposed with each other through a clearance member of ceramic paper consisting of a mixture of alumina fiber and zirconia powder, and the superposed wires were wound on a spool of a stainless alloy having a diameter of 50 cm. Thereafter pressurization starting conditions and depressurization starting conditions were varied as shown in Table 2, for heat treating the wires of respective samples with a total pressure of 1.0 MPa, an oxygen partial pressure of 0.02 MPa and a heat treatment temperature of 840° C. for a heat treatment time of 50 hours. After the heat treatment, the degrees of expansion of the wires were evaluated. Table 2 also shows the results.

TABLE 2

| Sample | Total Pressure (MPa) | Oxygen Partial Pressure (MPa) | Heat Treatment Temperature ( ) | Heat Treatment Time (Hr) | Pressurization Starting Condition (temperature) | Depressurization Starting Condition (temperature) | Expansion of Wire |
|---|---|---|---|---|---|---|---|
| 14 | 1.0 | 0.02 | 840 | 50 | before temperature increase (29) | after cooled to room temperature (30) | no |
| 15 | 1.0 | 0.02 | 840 | 50 | during temperature increase (500) | after cooled to room temperature (30) | yes |
| 16 | 1.0 | 0.02 | 840 | 50 | during heat treatment (840) | after cooled to room temperature (30) | yes |
| 17 | 1.0 | 0.02 | 840 | 50 | during temperature reduction (800) | after cooled to room temperature (30) | yes |
| 18 | 1.0 | 0.02 | 840 | 50 | before temperature increase (29) | during heat treatment (840) | yes |
| 19 | 1.0 | 0.02 | 840 | 50 | during temperature increase (500) | during heat treatment (840) | yes |
| 20 | 1.0 | 0.02 | 840 | 50 | during heat treatment (840) | during heat treatment (840) | yes |
| 21 | 1.0 | 0.02 | 840 | 50 | during temperature reduction (800) | during heat treatment (840) | yes |
| 22 | 1.0 | 0.02 | 840 | 50 | before temperature increase (29) | in the process of temperature reduction (700) | yes |
| 23 | 1.0 | 0.02 | 840 | 50 | during temperature increase (500) | in the process of temperature reduction (700) | yes |
| 24 | 1.0 | 0.02 | 840 | 50 | during heat treatment (840) | in the process of temperature reduction (700) | yes |
| 25 | 1.0 | 0.02 | 840 | 50 | during temperature reduction (800) | in the process of temperature reduction (700) | yes |

It is clearly understood from Table 2 that an effect of suppressing expansion of the wire can be attained in the processes of temperature increase and temperature reduction by starting pressurization before increasing the temperature and starting depressurization after cooling the wire to the room temperature in the step of heat treating the wire in a pressurized atmosphere. In other words, it is understood that the wire is expanded if the total pressure of the pressurized atmosphere is not kept in the prescribed range of at least 0.5 MPa from the process of temperature increase as the start point of the heat treatment in the pressurized atmosphere and to the process of temperature reduction as the end point of the heat treatment.

EXAMPLE 3

Tape-like wires of a bismuth-based oxide superconductor were prepared similarly to Example 1. The wires were superposed with each other through a clearance member of ceramic paper consisting of a mixture of alumina fiber and zirconia powder, and the superposed wires were wound on a spool of a stainless alloy having a diameter of 50 cm. A prescribed pressure was applied to the superposed wires and thereafter heating was started to heat treat the superposed wires under prescribed conditions. After the heat treatment, the wires were cooled to the room temperature, and thereafter the pressure was removed.

First heat treatment was performed on the wires of respective samples in a pressurized atmosphere having a total pressure of 1.0 MPa and an oxygen partial pressure of 0.005 MPa at a temperature of 810° C. for 50 hours. Thereafter rolling was performed on the wires with a rolling reduction of about 15%, and then second heat treatment was performed while varying the oxygen partial pressure in the pressurized atmosphere in the range of 0.2 to 0.001 MPa, as shown in Table 3. After the heat treatment, the degree of expansion of the wires was evaluated and the critical current was measured at a temperature of 77 K. Table 3 also shows the results.

TABLE 3

| Sample No. | Total Pressure (MPa) | Oxygen Partial Pressure (MPa) | Heat Treatment Temperature (° C.) | Heat Treatment Time (Hr) | Critical Current (A) | Expansion of Wire |
|---|---|---|---|---|---|---|
| 26 | 1.0 | 0.2 | 835 | 50 | 0 | no |
| 27 | 1.0 | 0.02 | 835 | 50 | 45 | no |
| 28 | 1.0 | 0.018 | 832 | 50 | 60 | no |
| 29 | 1.0 | 0.01 | 815 | 50 | 65 | no |
| 30 | 1.0 | 0.005 | 805 | 50 | 71 | no |
| 31 | 1.0 | 0.003 | 800 | 50 | 68 | no |
| 32 | 1.0 | 0.001 | 795 | 50 | 51 | no |

It is clearly understood from Table 3 that the wire was inhibited from expansion in each sample. This is because the total pressure of the pressurized atmosphere was 1.0 MPa.

While it was impossible to confirm superconduction in the sample No. 26 heat treated with the oxygen partial pressure of 0.2 MPa, the samples Nos. 27 to 32 heat treated in the pressurized atmospheres having oxygen partial pressures of not more than 0.02 MPa exhibited excellent superconductivity with high critical currents. It is understood that a higher critical current can be obtained with a lower heat treatment temperature as the oxygen partial pressure is reduced, regardless of the total pressure of the pressurized atmosphere. It is also understood that the heat treatment temperature is preferably in the range of 800 to 830° C., in order to obtain a relatively high critical current. The sample No. 32 heat treated in the pressurized atmosphere having an oxygen partial pressure of less than 0.003 MPa (0.001 MPa) exhibited a lower critical current as compared with the samples Nos. 28 to 31 heat treated in the pressurized atmospheres having oxygen partial pressures of at least 0.003 MPa.

EXAMPLE 4

Tape-like wires of a bismuth-based oxide superconductor were prepared similarly to Example 1. The wires were superposed with each other through a clearance member of ceramic paper consisting of a mixture of alumina fiber and zirconia powder, and the superposed wires were wound on a spool of a stainless alloy having a diameter of 50 cm. A prescribed pressure was applied to the superposed wires and thereafter heating was started to heat treat the superposed wires under prescribed conditions. After the heat treatment, the wires were cooled to the room temperature, and thereafter the pressure was removed.

First heat treatment was performed on the wires of respective samples in a pressurized atmosphere having a total pressure of 2.0 MPa and an oxygen partial pressure of 0.005 MPa at a temperature of 810° C. for 50 hours. Thereafter rolling was performed on the wires with a rolling reduction of about 15%, and then second heat treatment was performed while varying the oxygen partial pressure in the pressurized atmosphere in the range of 0.2 to 0.001 MPa, as shown in Table 4. After the heat treatment, the degree of expansion of the wires was evaluated and the critical current was measured at a temperature of 77 K. Table 4 also shows the results.

TABLE 4

| Sample No. | Total Pressure (MPa) | Oxygen Partial Pressure (MPa) | Heat Treatment Temperature (° C.) | Heat Treatment Time (Hr) | Critical Current (A) | Expansion of Wire |
|---|---|---|---|---|---|---|
| 33 | 2.0 | 0.2 | 835 | 50 | 0 | no |
| 34 | 2.0 | 0.02 | 830 | 50 | 63 | no |
| 35 | 2.0 | 0.01 | 815 | 50 | 68 | no |
| 36 | 2.0 | 0.008 | 810 | 50 | 70 | no |
| 37 | 2.0 | 0.001 | 795 | 50 | 43 | no |

It is clearly understood from Table 4 that the wire was inhibited from expansion in each sample. This is because the total pressure of the pressurized atmosphere was 2.0 MPa.

While it was impossible to confirm superconduction in the sample No. 33 heat treated with the oxygen partial pressure of 0.2 MPa, the samples Nos. 34 to 37 heat treated in the pressurized atmospheres having oxygen partial pressures of not more than 0.02 MPa exhibited excellent superconductivity with high critical currents. It is understood that a higher critical current can be obtained with a lower heat treatment temperature as the oxygen partial pressure is reduced, regardless of the total pressure of the pressurized atmosphere. It is also understood that the heat treatment temperature is preferably in the range of 810 to 830° C., in order to obtain a relatively high critical current. The sample No. 37 heat treated in the pressurized atmosphere having an oxygen partial pressure of less than 0.003 MPa (0.001 MPa) exhibited a lower critical current as compared with the samples Nos. 34 to 36 heat treated in the pressurized atmospheres having oxygen partial pressures of at least 0.003 MPa.

EXAMPLE 5

Tape-like wires of a bismuth-based oxide superconductor were prepared similarly to Example 1. The wires were superposed with each other through a clearance member of ceramic paper consisting of a mixture of alumina fiber and zirconia powder, and the superposed wires were wound on a spool of a stainless alloy having a diameter of 50 cm. A prescribed pressure was applied to the superposed wires and thereafter heating was started to heat treat the superposed wires under prescribed conditions. After the heat treatment, the wires were cooled to the room temperature, and thereafter the pressure was removed.

First heat treatment was performed on the wires of respective samples in a pressurized atmosphere having a total pressure of 3.0 MPa and an oxygen partial pressure of 0.005 MPa at a temperature of 810° C. for 50 hours. Thereafter rolling was performed on the wires with a rolling reduction of about 15%, and then second heat treatment was performed while varying the oxygen partial pressure in the pressurized atmosphere in the range of 0.2 to 0.001 MPa, as shown in Table 5. After the heat treatment, the degree of expansion of the wires was evaluated and the critical current was measured at a temperature of 77 K. Table 5 also shows the results.

TABLE 5

| Sample No. | Total Pressure (MPa) | Oxygen Partial Pressure (MPa) | Heat Treatment Temperature (° C.) | Heat Treatment Time (Hr) | Critical Current (A) | Expansion of Wire |
|---|---|---|---|---|---|---|
| 38 | 3.0 | 0.2 | 835 | 50 | 0 | no |
| 39 | 3.0 | 0.02 | 830 | 50 | 65 | no |
| 40 | 3.0 | 0.015 | 812 | 50 | 70 | no |
| 41 | 3.0 | 0.012 | 810 | 50 | 72 | no |
| 42 | 3.0 | 0.005 | 800 | 50 | 68 | no |
| 43 | 3.0 | 0.001 | 795 | 50 | 45 | no |

It is clearly understood from Table 5 that the wire was inhibited from expansion in each sample. This is because the total pressure of the pressuized atmosphere was 3.0 MPa.

While it was impossible to confirm superconduction in the sample No. 38 heat treated with the oxygen partial pressure of 0.2 MPa, the samples Nos. 39 to 43 heat treated in the pressurized atmospheres having oxygen partial pressures of not more than 0.02 MPa exhibited excellent superconductivity with high critical currents. It is understood that a higher critical current can be obtained with a lower heat treatment temperature as the oxygen partial pressure is reduced, regardless of the total pressure of the pressurized atmosphere. It is also understood that the heat treatment temperature is preferably in the range of 800 to 830° C., in order to obtain a relatively high critical current. The sample No. 43 heat treated in the pressurized atmosphere having an oxygen partial pressure of less than 0.003 MPa (0.001 MPa) exhibited a lower critical current as compared with the samples Nos. 39 to 42 heat treated in the pressurized atmospheres having oxygen partial pressures of at least 0.003 MPa.

EXAMPLE 6

Tape-like wires of a bismuth-based oxide superconductor were prepared similarly to Example 1. The wires were superposed with each other through a clearance member of ceramic paper consisting of a mixture of alumina fiber and zirconia powder, and the superposed wires were wound on a spool of a stainless alloy having a diameter of 50 cm. A prescribed pressure was applied to the superposed wires and thereafter heating was started to heat treat the superposed wires under prescribed conditions. After the heat treatment, the wires were cooled to the room temperature, and thereafter the pressure was removed.

First heat treatment was performed on the wires of respective samples in a pressurized atmosphere having a total pressure of 1.0 MPa and an oxygen partial pressure of 0.01 MPa at a temperature of 810° C. for 50 hours. Thereafter rolling was performed on the wires with a rolling reduction of about 15%, and then second heat treatment was performed while varying the heat treatment temperature in the range of 845 to 805° C., as shown in Table 6. After the heat treatment, the degree of expansion of the wires was evaluated and the critical current was measured at a temperature of 77 K. Table 6 also shows the results.

TABLE 6

| Sample No. | Total Pressure (MPa) | Oxygen Partial Pressure (MPa) | Heat Treatment Temperature ( ) | Heat Treatment Time (Hr) | Critical Current (A) | Expansion of Wire |
|---|---|---|---|---|---|---|
| 44 | 1.0 | 0.01 | 830 | 50 | 24 | no |
| 45 | 1.0 | 0.01 | 825 | 50 | 47 | no |
| 46 | 1.0 | 0.01 | 820 | 50 | 60 | no |
| 47 | 1.0 | 0.01 | 815 | 50 | 65 | no |
| 48 | 1.0 | 0.01 | 810 | 50 | 52 | no |
| 49 | 1.0 | 0.01 | 805 | 50 | 40 | no |
| 50 | 1.0 | 0.02 | 845 | 50 | 38 | no |
| 51 | 1.0 | 0.02 | 840 | 50 | 50 | no |
| 52 | 1.0 | 0.02 | 835 | 50 | 58 | no |
| 53 | 1.0 | 0.02 | 830 | 50 | 56 | no |
| 54 | 1.0 | 0.02 | 825 | 50 | 48 | no |
| 55 | 1.0 | 0.02 | 820 | 50 | 41 | no |

It is clearly understood from Table 6 that the wire was inhibited from expansion in each sample. This is because the total pressure of the pressurized atmosphere was 1.0 MPa.

When the oxygen partial pressure was 0.01 MPa, the samples Nos. 46 to 48 heat treated at the temperatures of 810 to 820° C. exhibited relatively high critical currents. When the oxygen partial pressure was 0.02 MPa, the samples Nos. 51 to 53 heat treated at the temperatures of 830 to 840° C. exhibited relatively high critical currents.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A pressure heat treatment apparatus comprising:

a pressure heat treatment furnace storing a target for heat treating said target in a pressurized atmosphere;

a pressure regulator for measuring the total pressure in said pressure heat treatment furnace and for regulating same;

oxygen gas feeding means for feeding oxygen gas into said pressure heat treatment furnace;

oxygen concentration measuring means for measuring the oxygen concentration in said pressure heat treatment furnace; and oxygen partial pressure control means, connected to receive an input from said pressure regulator and an input from said oxygen concentration measuring means and providing a control signal to said oxygen gas feeding means, for controlling the oxygen partial pressure in said pressure heat treatment furnace within a prescribed range in response to the total pressure measure by said pressure regulator and the oxygen concentration measured by said oxygen concentration measuring means, wherein said oxygen partial pressure control means operatively cooperating with said pressure regulator so that said total pressure is maintained equal to or greater than 0.5 MPa from the beginning to the end of heat treating said target while maintaining said oxygen concentration within said prescribed range.

2. The pressure heat treatment apparatus as recited in claim 1 wherein said oxygen partial pressure control means comprises a PID controller.

3. The pressure heat treatment apparatus as recited in claim 1 further comprising non-oxygen gas feeding means for feeding non-oxygen gas to said heat treatment furnace.

4. The pressure heat treatment apparatus as recited in claim 3 wherein said oxygen partial pressure control means controls both said oxygen gas feeding means and said non-oxygen gas feeding means.

5. The pressure heat treatment apparatus as recited in claim 4 wherein said oxygen partial pressure control means comprises a PID controller.

* * * * *